US012781990B2

(12) United States Patent
Cipolla et al.

(10) Patent No.: US 12,781,990 B2
(45) Date of Patent: Nov. 3, 2026

(54) THERMOSTAT

(71) Applicant: Carrier Corporation, Palm Beach Gardens, FL (US)

(72) Inventors: Mark E Cipolla, Chardon, OH (US); Zachariah S Simmering, Mansfield, OH (US); Jason R Ertel, Twinsburg, OH (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 170 days.

(21) Appl. No.: 18/931,595

(22) Filed: Oct. 30, 2024

(65) Prior Publication Data

US 2025/0146701 A1 May 8, 2025

Related U.S. Application Data

(60) Provisional application No. 63/595,746, filed on Nov. 2, 2023.

(51) Int. Cl.

| | |
|---|---|
| ***F24F 11/52*** | (2018.01) |
| ***F24F 11/523*** | (2018.01) |
| ***F24F 11/88*** | (2018.01) |
| ***H05K 5/00*** | (2006.01) |
| *F21S 4/20* | (2016.01) |
| *F21V 8/00* | (2006.01) |

(Continued)

(52) U.S. Cl.

CPC ............ *F24F 11/88* (2018.01); *F24F 11/523* (2018.01); *H05K 5/0018* (2022.08); *F21S 4/20* (2016.01); *F21Y 2115/15* (2016.08); *F24F 2110/10* (2018.01); *G02B 6/001* (2013.01)

(58) Field of Classification Search

None

See application file for complete search history.

(56) References Cited

U.S. PATENT DOCUMENTS 3,051,001 A 8/1962 Laviana et al.
7,159,790 B2 * 1/2007 Schwendinger ... G05D 23/1902 236/78 D (Continued)

FOREIGN PATENT DOCUMENTS

CN 205606850 U 9/2016
CN 208182075 U 12/2018

(Continued)

*Primary Examiner* — Xanthia C Relford
(74) *Attorney, Agent, or Firm* — Souad Hakim

(57) ABSTRACT

Described herein is a thermostat that comprises a plurality of pogo pins operatively connected to a plurality of terminal tabs associated with a terminal block assembly of the thermostat. The terminal block assembly is configured in/on a mounting bracket associated with the thermostat, such that a tip of the pogo pins extends at least partially outside from a front side of the mounting bracket. The thermostat further comprises a control unit comprising a printed circuit board that comprises a plurality of electrical pads, wherein the PCB is configured within a housing that is adapted to be removably fitted on the front side of the mounting bracket, wherein the pogo pins are configured to align and engage with the electrical pads of the PCB, upon fitment of the housing on the mounting bracket. to operatively connect the electrical pads of the PCB to the terminal tabs of the terminal block assembly.

20 Claims, 6 Drawing Sheets

(51) Int. Cl.

| | |
|---|---|
| *F21Y 115/15* | (2016.01) |
| *F24F 110/10* | (2018.01) |

(56) References Cited

U.S. PATENT DOCUMENTS

| | | | | |
|---|---|---|---|---|
| 7,541,539 | B2 | 6/2009 | Le | |
| 7,575,179 | B2 * | 8/2009 | Morrow | F24F 11/86 236/94 |
| 7,578,135 | B2 | 8/2009 | Mattheis | |
| 9,146,041 | B2 * | 9/2015 | Novotny | G05D 23/1919 |
| 9,528,720 | B2 * | 12/2016 | Novotny | F24F 11/76 |
| 9,587,848 | B2 * | 3/2017 | Adamik | F21V 23/005 |
| 9,677,776 | B2 | 6/2017 | Clifton et al. | |
| 9,696,058 | B2 * | 7/2017 | Novotny | F24F 11/62 |
| 9,752,793 | B2 * | 9/2017 | Novotny | H05K 13/00 |
| 9,897,339 | B2 * | 2/2018 | Emmons | F16M 13/02 |
| 9,989,273 | B2 * | 6/2018 | Read | F24F 11/30 |
| 10,066,848 | B1 * | 9/2018 | Lorenz | F24F 11/30 |
| 10,436,977 | B2 * | 10/2019 | Bergman | F21V 23/005 |
| 10,534,331 | B2 * | 1/2020 | Quam | F21V 23/005 |
| 10,591,877 | B2 * | 3/2020 | Quam | F21V 23/005 |
| 11,394,185 | B2 * | 7/2022 | Roosli | H02G 3/12 |
| 11,441,805 | B2 * | 9/2022 | Chung | G06F 3/04842 |
| 11,639,806 | B2 * | 5/2023 | Chung | C03C 17/3417 345/174 |
| 11,815,274 | B2 * | 11/2023 | Alsberg | G05D 23/1917 |
| 12,055,310 | B2 * | 8/2024 | Ramasamy | F24F 11/30 |
| 2005/0077365 | A1 * | 4/2005 | DeLuca | F24F 11/46 236/46 R |
| 2005/0279841 | A1 * | 12/2005 | Schwendinger | F24F 11/30 236/1 C |
| 2007/0246553 | A1 * | 10/2007 | Morrow | F24F 11/30 236/94 |
| 2013/0087629 | A1 * | 4/2013 | Stefanski | G05D 23/19 236/1 C |
| 2013/0268124 | A1 * | 10/2013 | Matsuoka | F24F 11/88 700/276 |
| 2013/0313331 | A1 * | 11/2013 | Warren | F24F 11/30 236/1 C |
| 2014/0306021 | A1 * | 10/2014 | Lam | G05D 23/1905 236/51 |
| 2014/0319233 | A1 * | 10/2014 | Novotny | H02H 9/04 236/94 |
| 2014/0324229 | A1 * | 10/2014 | Leen | G05D 23/19 700/276 |
| 2015/0159903 | A1 | 6/2015 | Marak et al. | |
| 2015/0160633 | A1 * | 6/2015 | Adamik | F21V 23/005 362/555 |
| 2015/0163945 | A1 * | 6/2015 | Barton | F21V 23/005 361/809 |
| 2016/0327301 | A1 * | 11/2016 | Ribbich | H05B 47/11 |
| 2017/0060150 | A1 * | 3/2017 | Stefanski | G01K 1/028 |
| 2017/0234568 | A1 * | 8/2017 | Read | F24F 11/30 248/205.4 |
| 2017/0234569 | A1 * | 8/2017 | Emmons | F16M 13/02 361/809 |
| 2020/0263898 | A1 * | 8/2020 | Alsberg | G05D 23/1917 |
| 2021/0356140 | A1 | 11/2021 | Alicorn et al. | |
| 2022/0065480 | A1 * | 3/2022 | Chung | G06F 1/3265 |
| 2023/0228441 | A1 | 7/2023 | Shum et al. | |
| 2023/0266036 | A1 * | 8/2023 | Irons | F24F 11/58 318/66 |
| 2024/0053040 | A1 * | 2/2024 | Ramasamy | F24F 11/89 |

FOREIGN PATENT DOCUMENTS

| | | | |
|---|---|---|---|
| CN | 210042084 | U | 2/2020 |
| CN | 211551973 | U | 9/2020 |
| CN | 216808849 | U | 6/2022 |
| JP | H08308065 | A | 11/1996 |
| WO | 2022140452 | A1 | 6/2022 |

* cited by examiner

THERMOSTAT

CROSS-REFERENCE TO RELATED APPLICATION

This patent application claims the benefit of U.S. Provisional Patent Application No. 63/595,746, filed on Nov. 2, 2023, which is incorporated by reference herein in its entirety.

BACKGROUND

This invention relates to the field of thermostats.

SUMMARY

Described herein is a thermostat. The thermostat comprises a plurality of pogo pins operatively connected to a plurality of terminal tabs associated with a terminal block assembly of the thermostat, wherein the terminal block assembly is configured in/on a mounting bracket associated with the thermostat, such that a tip of the plurality of pogo pins extends at least partially outside from a front side of the mounting bracket. The thermostat further comprises a control unit comprising a printed circuit board (PCB) that comprises a plurality of electrical pads, wherein the PCB is configured within a housing that is adapted to be removably fitted on the front side of the mounting bracket, wherein the pogo pins are configured to align and engage with the plurality of electrical pads of the PCB, upon fitment of the housing on the mounting bracket. to operatively connect the plurality of electrical pads of the PCB to the plurality of terminal tabs of the terminal block assembly.

In one or more embodiments, the terminal block assembly comprises a first terminal block and a second terminal block, each comprising a group of tabs that is a subset of the plurality of terminal tabs, wherein the first terminal block and the second terminal block are configured on opposite sides of a first cut-out-section, having a predefined shape, provided on the mounting bracket.

In one or more embodiments, the first terminal block is configured at a top end on one of the sides of the first cut-out section and the second terminal block is configured at a bottom end on another side of the first cut-out section.

In one or more embodiments, the first terminal block and the second terminal block are oriented such that the pogo pins associated with the first terminal block protrude from a bottom end of the first terminal block and the pogo pins associated with the second terminal block protrude from a top end of the second terminal block.

In one or more embodiments, each of the first terminal block and the second terminal block comprises a plurality of clamping elements that are configured to receive and clamp an end of a plurality of wires associated with one or more components of an HVAC system, wherein the clamping operatively connects the one or more components of the HVAC system to the terminal block assembly and the corresponding tabs.

In one or more embodiments, the thermostat comprises a back cover having a second cut-out-section, wherein the back cover is configured to be fitted on a rear side of the mounting bracket to secure and cover the terminal block assembly within the mounting bracket while allowing the plurality of wires to be inserted within the mounting bracket.

In one or more embodiments, the mounting bracket comprises one or more magnets configured within one or more first grooves provided at predefined positions on the mounting bracket, wherein the one or more magnets are configured to facilitate alignment and fitment of the housing on the front side of the mounting bracket.

In one or more embodiments, the one or more first grooves and the corresponding magnets are configured at corners of the mounting bracket.

In one or more embodiments, the housing comprises a first casing configured to be removably fitted on the front side of the mounting bracket, and a second casing configured to be removably fitted on a front side of the first casing to form the housing, such that the PCB remains enclosed between the first casing and the second casing, wherein, upon fitment of the first casing on the mounting bracket, the tip of the plurality of pogo pins extends/protrudes from the front side of the first casing and engages with the plurality of electrical pads of the PCB.

In one or more embodiments, the thermostat comprises one or more biasing elements configured between the second casing and the first casing.

In one or more embodiments, the second casing is fitted on the first casing using one or more fasteners, wherein the one or more fasteners are adapted to be magnetically attracted towards the one or more magnets of the mounting bracket, upon movement of the housing toward the front side of the mounting bracket, to facilitate alignment of the housing on the mounting bracket, and wherein the magnetic engagement of the one or more fasteners with the one or more magnets, upon fitment of the housing on the front side of the mounting bracket, secures the housing on the mounting bracket.

In one or more embodiments, the first casing comprises one or more threaded holes, and the second casing comprises one or more threaded second grooves configured in line with the threaded holes of the first casing, wherein the threaded holes and the threaded second grooves facilitate the fitment of the second casing to the first casing using the one or more fasteners.

In one or more embodiments, the one or more fasteners is a threaded screw extending through the threaded holes of the first casing and further into the threaded second grooves of the second casing, such that a head of the corresponding screw remains on a rear side of the first casing, wherein the head of the corresponding screw is adapted to be magnetically attracted towards and engage with the one or more magnets of the mounting bracket.

In one or more embodiments, the second casing is snap-fitted to the first casing, wherein the first casing and/or the second casing comprise one or more engaging elements that are adapted to be magnetically attracted toward the one or more magnets of the mounting bracket, upon movement of the housing towards the front side of the mounting bracket, to facilitate alignment of the housing on the mounting bracket, and wherein the magnetic engagement of the one or more engaging elements with the one or more magnets, upon fitment of the housing on the front side of the mounting bracket, secures the housing on the mounting bracket.

In one or more embodiments, the housing or the first casing is configured to be disengaged or detached from the mounting bracket upon application of a predefined pull force greater than a force of attraction between the magnets and the fasteners.

In one or more embodiments, the thermostat comprises an optical fiber extending along a periphery, on a front side, of the second casing, wherein the optical fiber is optically connected to a light source and configured to illuminate the optical fiber in a predefined color based on a temperature selected on the thermostat.

In one or more embodiments, the thermostat comprises a strip of LED light extending along a periphery, on a front side, of the second casing, wherein the strip of LED light is configured to illuminate in a predefined color based on a temperature selected on the thermostat.

In one or more embodiments, the thermostat comprises one or more buttons configured on the front side and/or one or more sides of the second casing, wherein the buttons are operatively coupled to the control unit and configured to allow selection of one or more indoor parameters to be maintained within an environment where the thermostat is located.

In one or more embodiments, the thermostat comprises a human-machine interface (HMI) configured on the front side of the second casing, wherein the HMI is operatively connected to the control unit and is configured to allow selection of one or more indoor parameters to be maintained within an environment where the thermostat is located, and display real-time values of the indoor parameters associated with the environment.

In one or more embodiments, the thermostat comprises one or more sensors operatively coupled to the control unit and configured to monitor the indoor parameters of the environment and detect the presence of occupants in the environment, wherein the one or more sensors comprise any or a combination of a temperature sensor, a humidity sensor, one or more air quality sensors, a pressure sensor, gas sensors, a smoke sensor, and an occupancy sensor.

The foregoing summary is illustrative only and is not intended to be in any way limiting. In addition to the illustrative aspects, embodiments, and features described above, further aspects, embodiments, features, and techniques of the subject disclosure will become more apparent from the following description taken in conjunction with the drawings.

BRIEF DESCRIPTION OF THE DRAWINGS

The accompanying drawings are included to provide a further understanding of the subject disclosure and are incorporated in and constitute a part of this specification. The drawings illustrate exemplary embodiments of the subject disclosure and, together with the description, serve to explain the principles of the subject disclosure.

In the drawings, similar components and/or features may have the same reference label. Further, various components of the same type may be distinguished by following the reference label with a second label that distinguishes among the similar components. If only the first reference label is used in the specification, the description is applicable to any one of the similar components having the same first reference label irrespective of the second reference label.

DETAILED DESCRIPTION

Figure 1A:
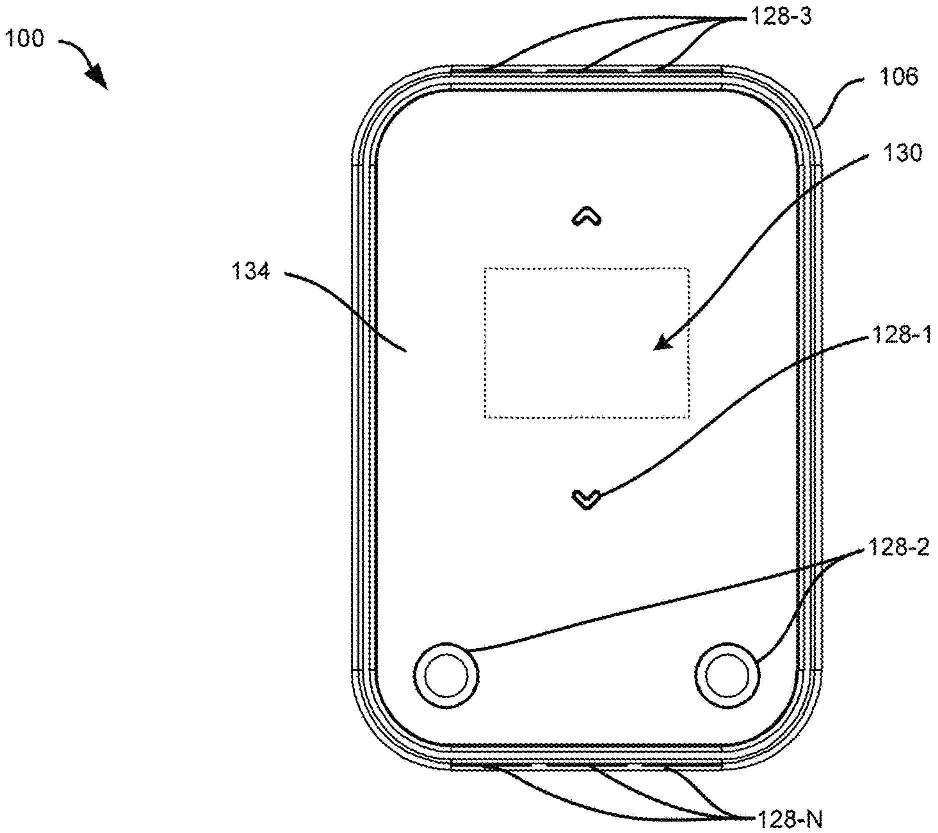
FIGS. 1A to 1C illustrate exemplary front view, perspective view, and rear view respectively of the thermostat in accordance with one or more embodiments of the subject disclosure.

The following is a detailed description of embodiments depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the subject disclosure as defined by the appended claims.

Various terms are used herein. To the extent a term used in a claim is not defined below, it should be given the broadest definition persons in the pertinent art have given that term as reflected in printed publications and issued patents at the time of filing.

In the specification, reference may be made to the spatial relationships between various components and to the spatial orientation of various aspects of components as the devices are depicted in the attached drawings. However, as will be recognized by those skilled in the art after a complete reading of the subject disclosure, the components of this invention. described herein may be positioned in any desired orientation. Thus, the use of terms such as “above”, “below”, “upper”, “lower”, “bottom”, “front”, “rear”, “first”, “second” or other like terms to describe a spatial relationship between various components or to describe the spatial orientation of aspects of such components should be understood to describe a relative relationship between the components or a spatial orientation of aspects of such components, respectively, as the mounting bracket, terminal blocks, first casing, second casing, pogo pins, magnets, fasteners, and corresponding components, described herein may be oriented in any desired direction.

Thermostats involve a mounting bracket that is installed on a wall to support the thermostat’s front casing. This front casing houses various electrical and electronic components necessary for the thermostat’s operation. However, the installation and removal of these thermostats from the wall may pose several challenges.

Existing thermostats are typically attached to the wall through the use of snaps and long pins on the back of the thermostat, however, aligning and securing the thermostat’s front casing to the mounting bracket can be cumbersome and challenging. In addition, to secure the front casing to the mounting bracket, screws may also be used, however, again the alignment of the front casing with the mounting bracket can be problematic, resulting in difficulty fastening the front casing securely. Another issue arises during the connection of the electrical components and printed circuit board (PCB) within the thermostat to the wires associated with heating, ventilation, and air conditioning (HVAC) systems extending from the wall. This process is often intricate and time-consuming.

These difficulties in thermostat installation and removal have prompted a need for an improved solution that simplifies the entire process, from installing the thermostat on the wall while aligning and attaching the front casing to the mounting bracket and securely connecting the components of the thermostat to the HVAC wires, and further removing the front casing from the mounting bracket or the thermostat from the wall.

There is, therefore, a need to overcome the drawbacks, shortcomings, and limitations associated with existing thermostats and the associated assembling process, by providing a simple and improved thermostat that can be easily installed on and removed from walls, which enables easier alignment and attachment of the front casing to the mounting bracket and also allows easier and secure connection of the components of the thermostat to the HVAC wires and an external power source.

Figure 1B:
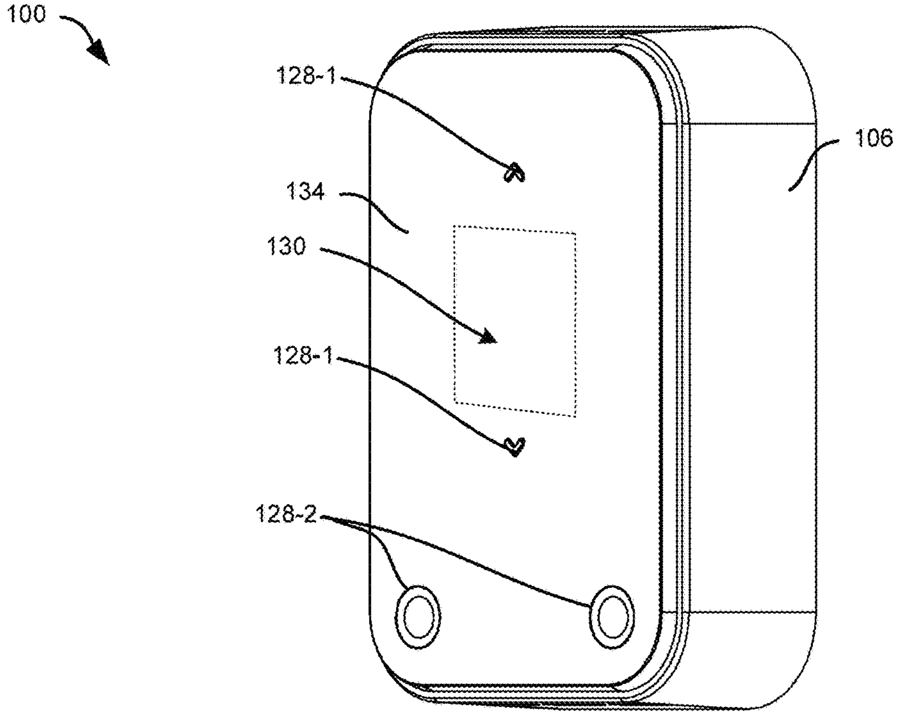
Figure 1C:
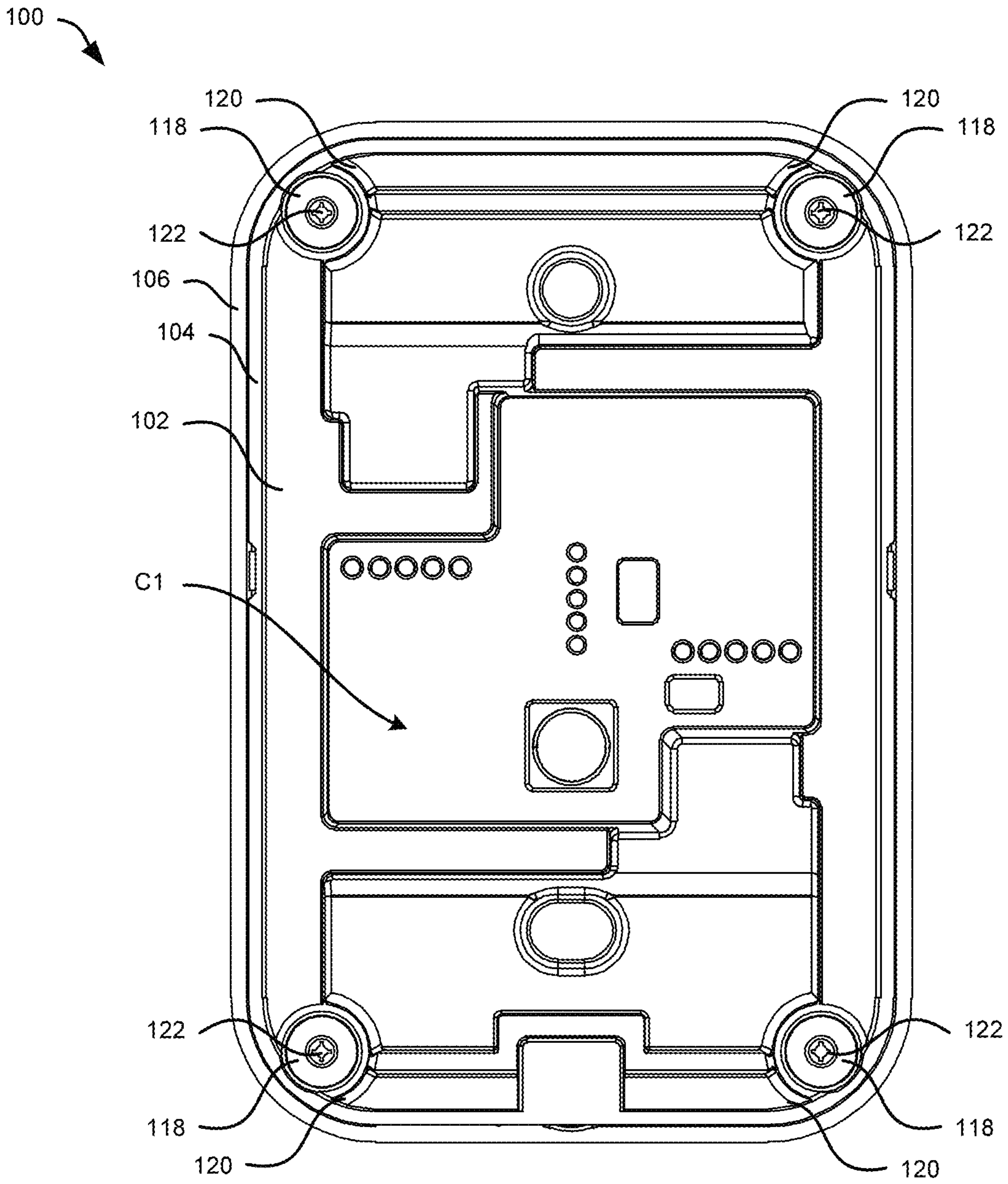
Figure 1D:
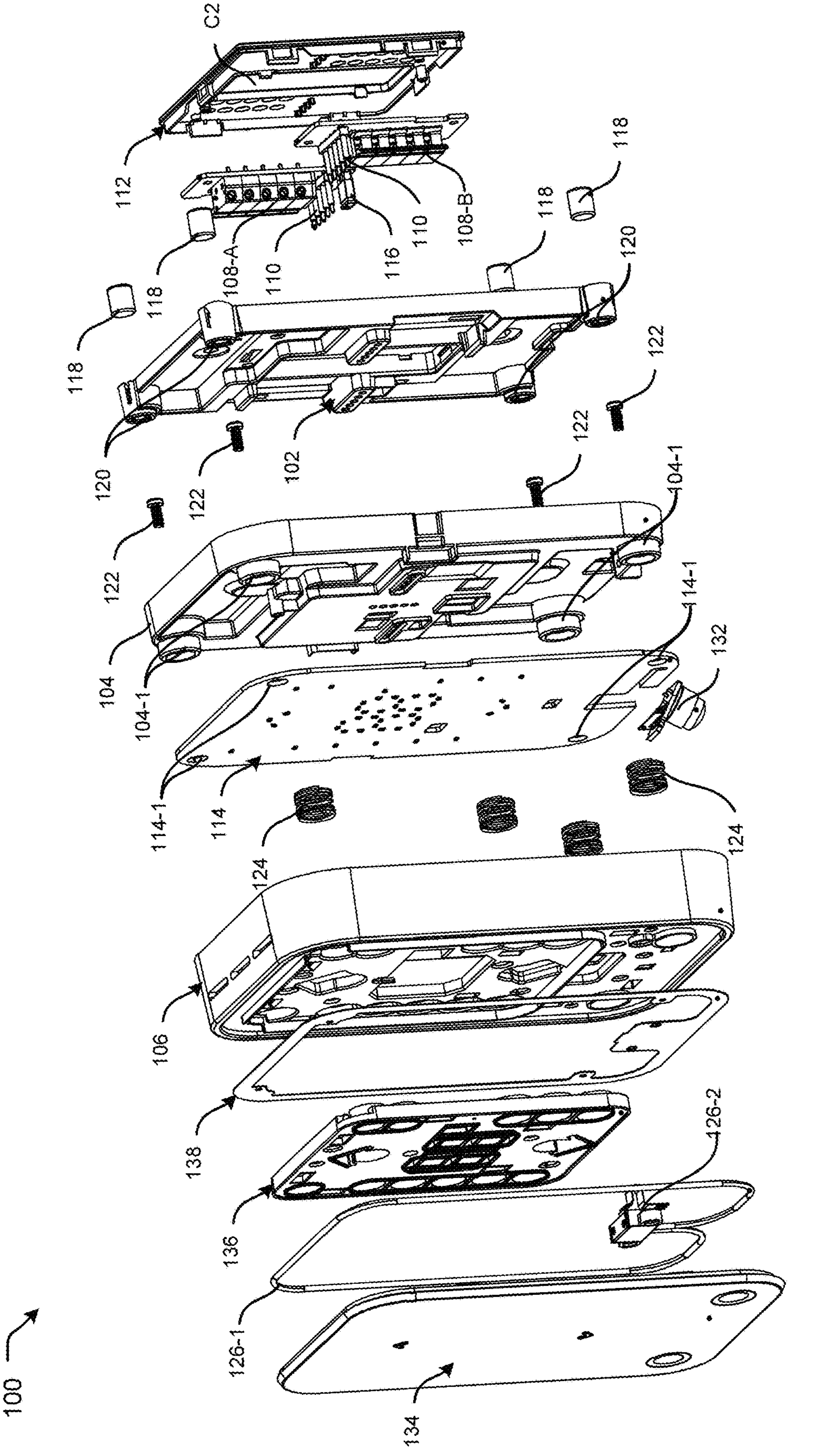
FIG. 1D illustrates an exemplary exploded view of the thermostat in accordance with one or more embodiments of the subject disclosure.
Figure 2A:
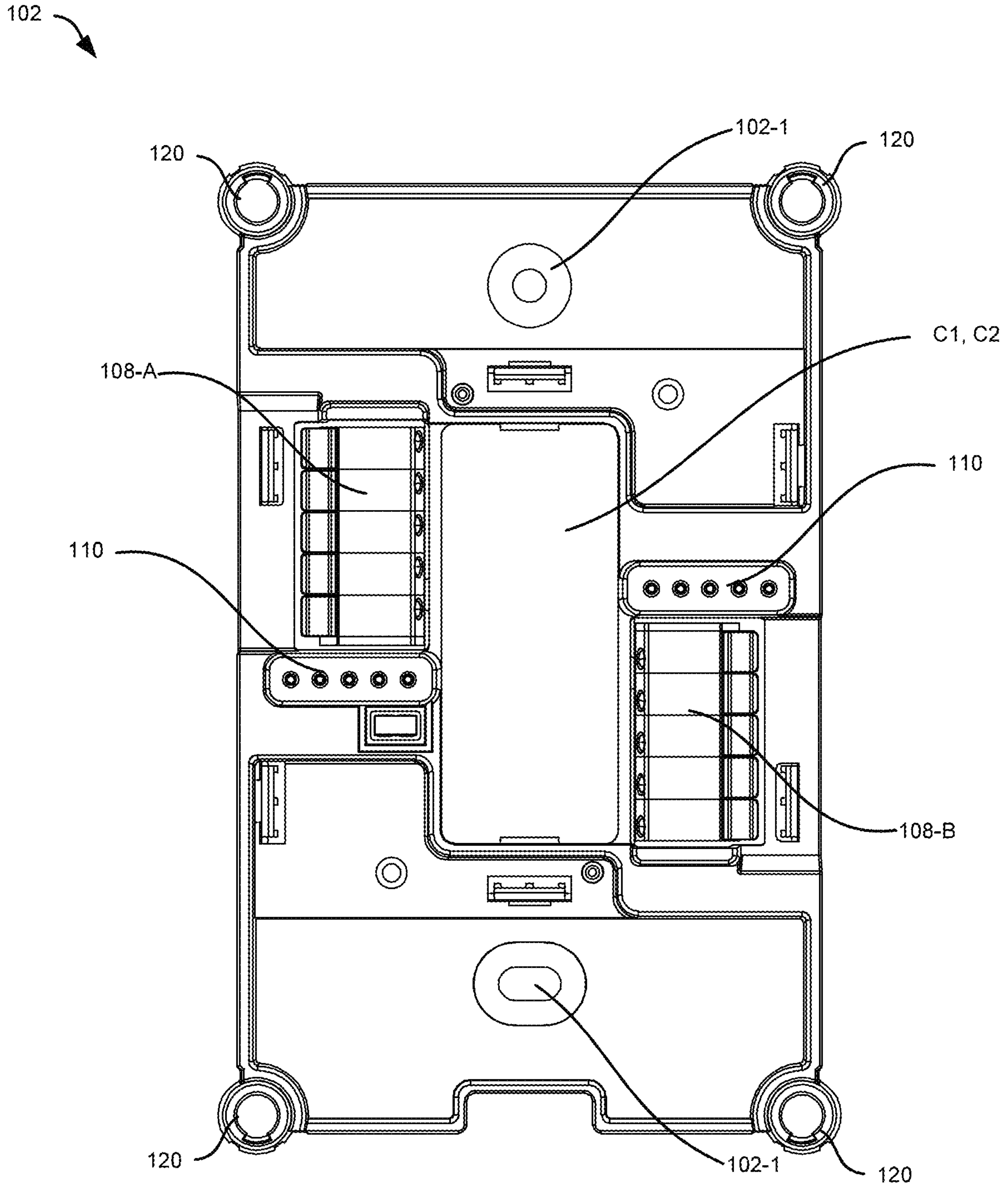
FIGS. 2A to 2D illustrates an exemplary front view, side view, bottom view, and rear view respectively of the mounting bracket with a back cover in accordance with one or more embodiments of the subject disclosure.
Figure 2B:
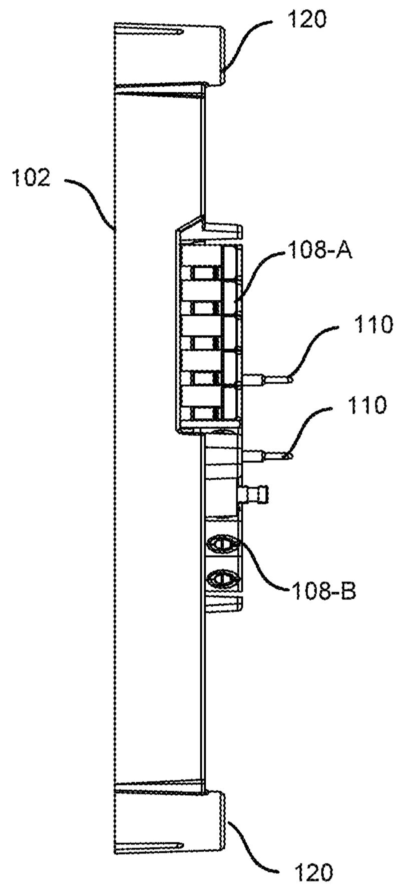
Figure 2C:
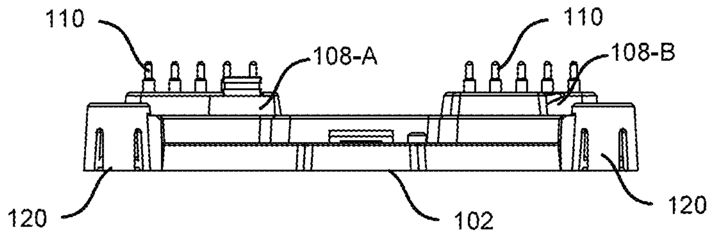
Figure 2D:
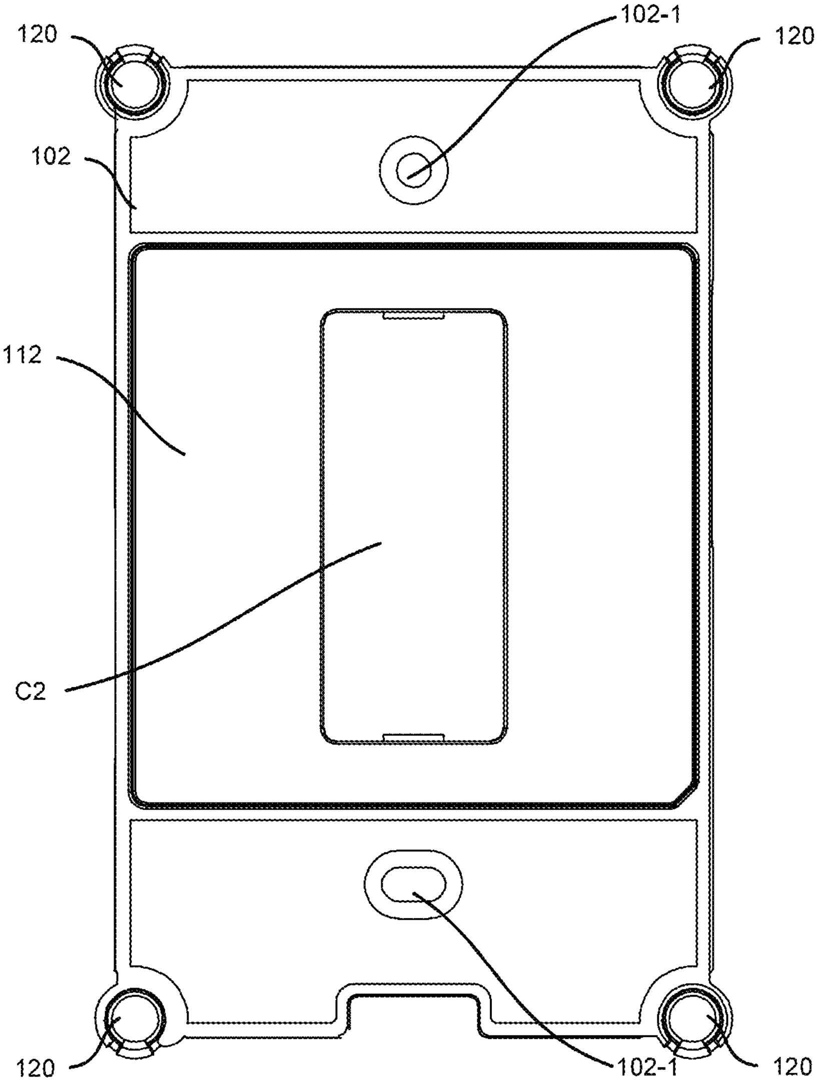

Referring to FIGS. 1A to 2D, the thermostat 100 can include a mounting bracket 102 configured to be fixed on a wall of an environment (or space) where the thermostat 100 is to be installed. The thermostat 100 can further include a housing securely accommodating one or more components of the thermostat 100. The housing can be adapted to be removably fitted on the front side of the mounting bracket 102. The housing can further include a first casing 104 that can be removably fitted on the front side of the mounting bracket 102 and a second casing 106 that can be removably fitted on the front side of the first casing 104 to form the housing.

The thermostat 100 can further include a terminal block assembly that can include a plurality of terminal tabs. In one or more embodiments, the terminal block assembly can include a first terminal block 108-A and a second terminal block 108-B being off-set from each other, where the first terminal block and the second terminal block can include a group of tabs that can be a subset of the plurality of terminal tabs. Accordingly, the total number of terminal tabs associated with a single terminal block can be offset and divided into two different terminal blocks. The mounting bracket 102 can include a first cut-out section C1 having a predefined shape. Further, the first terminal block 108-A and the second terminal block 108-B can be configured on opposite sides of the first cut-out section C1 of the mounting bracket 102.

In addition, the first terminal block 108-A and the second terminal block 108-B can include a plurality of clamping elements that can be configured to receive and clamp an end of a plurality of wires associated with one or more components of an HVAC system and/or an external power source. Accordingly, the first-cut-out section C1 can allow the wires to be inserted into the mounting bracket 102 and clamped to the first terminal block 108-A and the second terminal block 108-B, thereby electrically connecting the wires or components of the HVAC and/or the power source to the corresponding terminal tabs of the first terminal block 108-A and the second terminal block 108-B.

Further, each of the first terminal block 108-A and the second terminal block 108-B can include a plurality of pogo pins 110 operatively connected to the corresponding terminal tabs, such that one of the pogo pins 110 remains associated with one of the terminal tabs. The terminal block assembly can be configured in/on the mounting bracket 102 such that the pogo pins 110 protrude from the terminal tabs and further a tip of the pogo pins 110 extends at least partially outside (through openings provided on the mounting bracket 102) from a front side of the mounting bracket 102. Furthermore, the thermostat 100 can include a back cover 112 having a second cut-out section (C2). The back cover 112 can be configured to be fitted on the rear side of the mounting bracket 102 to secure and cover the terminal block assembly within the mounting bracket 102 while allowing the wires (extending out from the wall) to be inserted within the mounting bracket 102 via the second cut-out section (C2)

In one or more embodiments, as shown in FIGS. 2A to 2D, the first terminal block 108-A can be configured at a top end on one of the sides of the first cut-out section (C1) and the second terminal block 108-B can be configured at a bottom end on another side of the first cut-out section (C1). Further, in one or more embodiments, the first terminal block 108-A and the second terminal block 108-B can be oriented such that the pogo pins 110 associated with the first terminal block 108-A protrudes from the bottom end of the first terminal block 108-A and the pogo pins 110 associated with the second terminal block 108-B protrudes from the top end of the second terminal block 108-B. However (not shown), the first terminal block 108-A and the second terminal block 108-B can also be configured at other positions and other orientations along any of the sides of the first cut-out-section, which may allow the wires (extending out from the wall) to be easily inserted into the mounting bracket 102 via the first cut-out-section and the second cut-out section and be further securely clamped to the first terminal block 108-A and the second terminal block 108-B.

The thermostat 100 can further include a control unit comprising one or more processors coupled to a memory storing instructions executable by the processors to enable the thermostat 100 to perform one or more designated operations. In one or more embodiments, the thermostat 100 can include a communication unit operatively coupled to the control unit, which wirelessly connects the thermostat 100 to mobile devices of occupants and/or smart home devices present in a predefined area around the thermostat 100, and further connects the thermostat 100 to a controller of the HVAC system. Accordingly, the control unit and the communication unit can allow the occupant to remotely monitor and control the operation of the thermostat 100 and the HVAC system.

The components of the control unit and the communication unit can be mounted on a printed circuit board (PCB) 114 that comprises a plurality of electrical pads. The PCB 114 can be configured within the housing, being secured between the first casing 104 and the second casing 106. The first casing 104 can include openings to allow the tip of the pogo pins 110 to extend from the front side of the first casing 104 upon fitment of the housing on the mounting bracket 102. Accordingly, the pogo pins 110 are configured to align and engage with the electrical pads of the PCB 114, upon fitment of the housing on the mounting bracket 102, to operatively connect the electrical pads of the PCB 114 to the terminal tabs of the terminal block assembly, thereby operatively connecting the control unit to the components of the HVAC system and/or the power source.

In one or more embodiments, the thermostat 100 can additionally include a pin header 116 adapted to be installed over the tip of the pogo pins 110, such that the tip of the pogo pins 110 remains within the header 116. The pin header 116 can further include a cap adapted to cover the top of the pin header 116, which may be used on the unused pogo pins 110 to restrict contact and electrical connection between the electrical pads of the PCB 114 and the unused pogo pins 110.

In one or more embodiments, the mounting bracket 102 can include one or more magnets 118 configured within one or more first grooves 120 provided at predefined positions on the mounting bracket 102. The magnets 118 can be configured to facilitate alignment and fitment of the housing on the front side of the mounting bracket 102. In one or more embodiments, the first grooves 120 can be provided at corners of the mounting bracket 102, and one of the magnets 118 can be disposed of or fixed in each of the first grooves 120, however, the first grooves 120 and magnets 118 can also be provided at other positions on the mounting bracket 102 without any limitations.

In one or more embodiments, the second casing 106 can be fitted on the first casing 104 using one or more fasteners 122 such as but not limited to a threaded screw 122. The fasteners 122 can be made of a material that is magnetically attracted towards the magnets 118 of the mounting bracket 102, upon movement of the housing towards the front side of the mounting bracket 102, thereby facilitating alignment of the housing on the mounting bracket 102. Further, upon fitment of the housing on the front side of the mounting bracket 102, the magnetic engagement of the fasteners 122 with the magnets 118 secures the housing on the mounting bracket 102 without using any fastener between the housing and the mounting bracket 102.

In one or more embodiments, the first casing 104 can include one or more first holes (which may be threaded or non-threaded) 104-1, and the PCB 114 can also include one or more second holes (which may be threaded or non-threaded) 114-1. In addition, the second casing 106 can include one or more threaded second grooves or third holes configured in line with the threaded holes of the first casing 104, The first holes 104-1, the second hole 114-1, and the second grooves (or third holes) can facilitate the fitment of the second casing 106 to the first casing 104 using the fasteners 122. In one or more embodiments, the first casing 104 can include the first holes 104-1 at four corners, the second casing 106 can include the second grooves (or third holes) at the four corners, and the PCB 114 can include the second holes 114-1 at four corner, such that the first holes 104-1, the second hole 114-1, and the second grooves (or third holes) remain in line, however, the first holes 104-1 of the first casing 104, the second holes 114-1 of the PCB 114, and the grooves (or third holes) of the second casing 106 can be provided at other positions as well, as long as the first hole 104-1*s*, the second hole 114-1, and the second grooves are in line.

In one or more embodiments, the fasteners 122 can be a threaded screw 122 that can extend through the threaded first holes 104-1 of the first casing 104, the second holes 114-1 of the PCB 114, and further into the threaded second grooves of the second casing 106, such that a head of the corresponding screw 122 remains seated on a rear side of the first casing 104. In one or more embodiments, at least the head of the corresponding screw 122 can be made of a material adapted to be magnetically attracted towards and engage with the magnets 118 of the mounting bracket 102.

Thus, upon movement of the housing towards the front side of the mounting bracket 102, the fasteners 122 (screw) can be magnetically attracted towards the magnets 118 of the mounting bracket 102, thereby facilitating alignment of the housing on the mounting bracket 102. Further, upon fitment of the housing on the front side of the mounting bracket 102, the magnetic engagement of the fasteners 122 (screw) with the magnets 118 secures the housing on the mounting bracket 102 without using any additional fastener between the housing and the mounting bracket 102. Furthermore, the housing or the first casing 104 can be configured to be disengaged or detached from the mounting bracket 102 upon application of a predefined pull force greater than a force of attraction between the magnets 118 and the fasteners 122. Furthermore, the thermostat 100 can additionally include a biasing element 124 such as a spring configured between the first casing 104 and the second casing 106 to allow removal of the second casing 106 from the first casing 104 upon unfastening or removal of the fasteners 122.

In one or more embodiments (not shown), the fasteners 122 can be a bolt that can extend through the first holes 104-1 of the first casing 104, the second holes 114-1 of the PCB 114, and further into the third holes of the second casing 106, such that a head of the corresponding bolt remains seated on a rear side of the first casing 104 and a free end of the shank of the bolt gets secured on the front side of the second casing 106 using a nut. In such embodiments, the first holes 104-1, the second holes 114-1, and the third holes may need not be threaded. In one or more embodiments, at least the head of the corresponding bolt can be made of a material adapted to be magnetically attracted towards and engage with the magnets 118 of the mounting bracket 102.

In one or more embodiments (not shown), the second casing 106 can be snap-fitted to the first casing 104. The first casing 104 and/or the second casing 106 can include one or more engaging elements that can be adapted to be magnetically attracted towards the magnets 118 of the mounting bracket 102, upon movement of the housing towards the front side of the mounting bracket 102, to facilitate alignment of the housing on the mounting bracket 102. Further, the magnetic engagement of the engaging elements with the magnets 118, upon fitment of the housing on the front side of the mounting bracket 102, secures the housing on the mounting bracket 102.

In one or more embodiments (not shown), the mounting bracket 102 can also include one or more holes (fourth holes) 102-1 that allow mounting of the mounting bracket 102 on the wall using another set of one or more threaded screws, such that the back cover 112 secures the rear side of the mounting bracket 102 while allows the wires (extending from the wall) to be inserted within the mounting bracket 102 via the cut-out sections (C1 and C2).

In one or more embodiments, the thermostat 100 can include an optical fiber 126-1 extending along the periphery, on the front side, of the second casing 106. The optical fiber 126-1 can be optically connected to a light source 126-2. The light source 126-2 can be further operatively connected to the control unit and configured to illuminate the optical fiber 126-1 in a predefined color based on a temperature selected on the thermostat 100. Further, in one or more embodiments (not shown), the thermostat 100 can include a strip of LED light or one or more LED lights extending along the periphery, on the front side, of the second casing 106. The LED light can be further operatively connected to the control unit and configured to illuminate a predefined color based on a temperature selected on the thermostat 100.

In one or more embodiments, the thermostat 100 can include one or more buttons 128-1 to 128-N (collectively referred to as buttons 128, hereinafter) configured on the front side and/or one or more sides of the second casing 106. The buttons 128 can be operatively coupled to the control unit and configured to allow the selection of one or more indoor parameters to be maintained within the environment where the thermostat 100 is located.

In one or more embodiments, the thermostat 100 can include a human-machine interface (HMI) 130 configured on the front side of the second casing 106. The HMI 130 can be operatively connected to the control unit and is configured to allow the selection of one or more indoor parameters to be maintained within the environment, and also display real-time values of the indoor parameters associated with the environment. The HMI 130 may include a touchscreen display that may replace the buttons. However, the thermostat 100 may only include a display screen (also designated as 130, herein) displaying real-time values of the indoor parameters associated with the environment, and the buttons 128 to allow the selection of one or more indoor parameters to be maintained within the environment.

In one or more embodiments, the thermostat 100 can include one or more sensors operatively coupled to the control unit and configured to monitor the indoor parameters of the environment and detect the presence of occupants in the environment. The indoor parameters can include temperature, humidity, air quality, pressure, and the like. In one or more embodiments, the sensors can include any or a combination of a temperature sensor, a humidity sensor, one or more air quality sensors, a pressure sensor, gas sensors, a smoke sensor, and an occupancy sensor (shown as 132 in FIG. 1D).

In addition, the thermostat 100 can include a front lens 134 that may be a transparent or translucent cover placed over the thermostat's display/HMI 130, buttons 128, and/or the optical fiber 126-1, on the front side of the second casing 106. The front lens 134 can protect the internal components of the thermostat 100, specifically the HMI/display 130, and provide a user-friendly interface. The front lens 134 can also enhance the thermostat's front appearance while allowing radio waves or signals to be transmitted to and from the thermostat 100. Further, the thermostat 100 can include a light blocker 136, and/or a protective film configured 138 behind the optical fiber 126-1 and/or the HMI/display 130 to protect the PCB 114 and other components of the thermostat 100 from heat or illumination caused by the optical fiber 126-1 and/or the HMI/display 130.

It should be obvious to a person skilled in the art that while various embodiments of this subject disclosure have been elaborated for a total of two terminal blocks with 6 pogo pins and 6 terminal tabs each for the sake of simplicity and better explanation purpose, however, the teachings of this subject disclosure are equally applicable for the thermostat having a different configuration and including a different number of terminal blocks, pogo pins, and terminal tabs, and all such embodiments are well within the scope of this subject disclosure.

Thus, this invention (thermostat) overcome the drawbacks, shortcomings, and limitations associated with existing thermostat and the associated assembling process, by providing a simple and improved thermostat that can be easily installed on and removed from walls, which enables easier alignment and attachment of the front casing to the mounting bracket and also allows easier and secure connection of the components of the thermostat to the HVAC wires and power source.

The thermostat 100 can be operatively coupled to a website and so be operable from any internet-enabled mobile device. Examples of mobile devices may include, but are not limited to, a smartphone, a portable computer, a personal digital assistant, a handheld device, and a workstation. The mobile device may be communicatively coupled or in communication with the thermostat 100 through a network.

In one or more implementations, the network can be a wireless network, a wired network or a combination thereof. Network can be implemented as one of the different types of networks, such as intranet, local area network (LAN), wide area network (WAN), the internet, and the like. Further, the network may either be a dedicated network or a shared network. The shared network represents an association of the different types of networks that use a variety of protocols, for example, Hypertext Transfer Protocol (HTTP), Transmission Control Protocol/Internet Protocol (TCP/IP), Wireless Application Protocol (WAP), and the like, to communicate with one another. Further, network can include a variety of network devices, including transceivers, routers, bridges, servers, computing devices, storage devices, and the like. The network can be a cellular network or mobile communication network based on various technologies, including but not limited to a Wireless Fidelity (Wi-Fi), Global System for Mobile (GSM), General Packet Radio Service (GPRS), Code Division Multiple Access (CDMA), Long Term Evolution (LTE), WiMAX, 5G or 6G network protocols, and the like. Accordingly, the communication unit can include a Wireless Fidelity (WIFI) module, Global System for Mobile (GSM) module, General Packet Radio Service (GPRS) module, Code Division Multiple Access (CDMA) module, Long Term Evolution (LTE) module, WiMAX module, 5G or 6G network module, and the like.

While the subject disclosure has been described with reference to exemplary embodiments, it will be understood by those skilled in the art that various changes may be made and equivalents may be substituted for elements thereof without departing from the scope of the subject disclosure as defined by the appended claims. Modifications may be made to adopt a particular situation or material to the teachings of the subject disclosure without departing from the scope thereof. Therefore, it is intended that the subject disclosure not be limited to the particular embodiment disclosed, but that the subject disclosure includes all embodiments falling within the scope of the subject disclosure as defined by the appended claims.

In interpreting the specification, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refer to at least one of something selected from the group consisting of A, B, C . . . and N, the text should be interpreted as requiring only one element from the group, not A plus N, or B plus N, etc.

The invention claimed is:

1. A thermostat comprising:

a plurality of pogo pins operatively connected to a plurality of terminal tabs associated with a terminal block assembly of the thermostat, wherein the terminal block assembly is configured in/on a mounting bracket associated with the thermostat, such that a tip of the plurality of pogo pins extends at least partially outside from a front side of the mounting bracket; and a control unit comprising a printed circuit board (PCB) that comprises a plurality of electrical pads, wherein the PCB is configured within a housing that is adapted to be removably fitted on the front side of the mounting bracket, wherein the pogo pins are configured to align and engage with the plurality of electrical pads of the PCB, upon fitment of the housing on the mounting bracket, to operatively connect the plurality of electrical pads of the PCB to the plurality of terminal tabs of the terminal block assembly.

2. The thermostat of claim 1, wherein the terminal block assembly comprises:

a first terminal block and a second terminal block, each comprising a group of tabs that is a subset of the plurality of terminal tabs, wherein the first terminal block and the second terminal block are configured on opposite sides of a first cut-out-section, having a predefined shape, provided on the mounting bracket.

3. The thermostat of claim 2, wherein the first terminal block is configured at a top end on one of the sides of the first cut-out section and the second terminal block is configured at a bottom end on another side of the first cut-out section.

4. The thermostat of claim 2, wherein the first terminal block and the second terminal block are oriented such that the pogo pins associated with the first terminal block protrudes from a bottom end of the first terminal block and the pogo pins associated with the second terminal block protrudes from a top end of the second terminal block.

5. The thermostat of claim 2, wherein each of the first terminal block and the second terminal block comprises a plurality of clamping elements that are configured to receive and clamp an end of a plurality of wires associated with one or more components of an HVAC system, wherein the clamping operatively connects the one or more components of the HVAC system to the terminal block assembly and the corresponding tabs.

6. The thermostat of claim 1, wherein the thermostat comprises a back cover having a second cut-out-section, wherein the back cover is configured to be fitted on a rear side of the mounting bracket to secure and cover the terminal block assembly within the mounting bracket while allowing the plurality of wires to be inserted within the mounting bracket.

7. The thermostat of claim 1, wherein the mounting bracket comprises one or more magnets configured within one or more first grooves provided at predefined positions on the mounting bracket, wherein the one or more magnets are configured to facilitate alignment and fitment of the housing on the front side of the mounting bracket.

8. The thermostat of claim 7, wherein the one or more first grooves and the corresponding magnets are configured at corners of the mounting bracket.

9. The thermostat of claim 1, wherein the housing comprises:

a first casing configured to be removably fitted on the front side of the mounting bracket; and a second casing configured to be removably fitted on a front side of the first casing to form the housing, such that the PCB remains enclosed between the first casing and the second casing, wherein, upon fitment of the first casing on the mounting bracket, the tip of the plurality of pogo pins extends/protrudes from the front side of the first casing and engages with the plurality of electrical pads of the PCB.

10. The thermostat of claim 9, wherein the thermostat comprises one or more biasing elements configured between the second casing and the first casing.

11. The thermostat of claim 10, wherein the second casing is fitted on the first casing using one or more fasteners, wherein the one or more fasteners are adapted to be magnetically attracted towards the one or more magnets of the mounting bracket, upon movement of the housing towards the front side of the mounting bracket, to facilitate alignment of the housing on the mounting bracket, and wherein the magnetic engagement of the one or more fasteners with the one or more magnets, upon fitment of the housing on the front side of the mounting bracket, secures the housing on the mounting bracket.

12. The thermostat of claim 9, wherein the first casing comprises one or more threaded holes, and the second casing comprises one or more threaded second grooves configured in line with the threaded holes of the first casing, wherein the threaded holes and the threaded second grooves facilitate the fitment of the second casing to the first casing using the one or more fasteners.

13. The thermostat of claim 12, wherein the one or more fasteners is a threaded screw extending through the threaded holes of the first casing and further into the threaded second grooves of the second casing, such that a head of the corresponding screw remains on a rear side of the first casing, wherein the head of the corresponding screw is adapted to be magnetically attracted towards and engage with the one or more magnets of the mounting bracket.

14. The thermostat of claim 9, wherein the second casing is snap-fitted to the first casing, wherein the first casing and/or the second casing comprise one or more engaging elements that are adapted to be magnetically attracted towards the one or more magnets of the mounting bracket, upon movement of the housing towards the front side of the mounting bracket, to facilitate alignment of the housing on the mounting bracket, and wherein the magnetic engagement of the one or more engaging elements with the one or more magnets, upon fitment of the housing on the front side of the mounting bracket, secures the housing on the mounting bracket.

15. The thermostat of claim 9, wherein the housing or the first casing is configured to be disengaged or detached from the mounting bracket upon application of a predefined pull force greater than a force of attraction between the magnets and the fasteners.

16. The thermostat of claim 9, wherein the thermostat comprises an optical fiber extending along a periphery, on a front side, of the second casing, wherein the optical fiber is optically connected to a light source and configured to illuminate the optical fiber in a predefined color based on a temperature selected on the thermostat.

17. The thermostat of claim 9, wherein the thermostat comprises a strip of LED light extending along a periphery, on a front side, of the second casing, wherein the strip of LED light is configured to illuminate in a predefined color based on a temperature selected on the thermostat.

18. The thermostat of claim 9, wherein the thermostat comprises one or more buttons configured on the front side and/or one or more sides of the second casing, wherein the buttons are operatively coupled to the control unit and configured to allow selection of one or more indoor parameters to be maintained within an environment where the thermostat is located.

19. The thermostat of claim 9, wherein the thermostat comprises a human-machine interface (HMI) configured on the front side of the second casing, wherein the HMI is operatively connected to the control unit and is configured to:

allow selection of one or more indoor parameters to be maintained within an environment where the thermostat is located; and display real-time values of the indoor parameters associated with the environment.

20. The thermostat of claim 1, wherein the thermostat comprises one or more sensors operatively coupled to the control unit and configured to monitor the indoor parameters of the environment and detect the presence of occupants in the environment, wherein the one or more sensors comprise any or a combination of a temperature sensor, a humidity sensor, one or more air quality sensors, a pressure sensor, gas sensors, a smoke sensor, and an occupancy sensor.

* * * * *